United States Patent
Straubinger et al.

(10) Patent No.: US 9,376,764 B2
(45) Date of Patent: Jun. 28, 2016

(54) PHYSICAL VAPOR TRANSPORT GROWTH SYSTEM FOR SIMULTANEOUSLY GROWING MORE THAN ONE SIC SINGLE CRYSTAL AND METHOD OF GROWING

(71) Applicant: SiCrystal AG, Nuremberg (DE)

(72) Inventors: Thomas Ludwig Straubinger, Mohrendorf (DE); Michael Vogel, Nuremberg (DE); Andreas Wohlfart, Baiersdorf (DE); Erwin Schmitt, Grobenseebach (DE)

(73) Assignee: SiCrystal AG, Nuremberg (DE)

( * ) Notice: Subject to any disclaimer, the term of this patent is extended or adjusted under 35 U.S.C. 154(b) by 577 days.

(21) Appl. No.: 13/768,605

(22) Filed: Feb. 15, 2013

(65) Prior Publication Data
US 2013/0305983 A1    Nov. 21, 2013

(30) Foreign Application Priority Data

May 16, 2012    (EP) .................................... 12168341

(51) Int. Cl.
| | |
|---|---|
| *C30B 23/06* | (2006.01) |
| *C30B 23/02* | (2006.01) |
| *C30B 23/00* | (2006.01) |
| *C30B 29/36* | (2006.01) |

(52) U.S. Cl.
CPC ............... *C30B 23/02* (2013.01); *C30B 23/005* (2013.01); *C30B 23/06* (2013.01); *C30B 29/36* (2013.01)

(58) Field of Classification Search
CPC ........ C30B 23/002; C30B 23/02; C30B 23/06
See application file for complete search history.

(56) References Cited

U.S. PATENT DOCUMENTS

| | | | |
|---|---|---|---|
| 6,344,085 B2 | 2/2002 | Kuhn et al. | |
| 7,279,040 B1 | 10/2007 | Wang | |
| 2001/0004875 A1* | 6/2001 | Kuhn et al. ..................... | 117/11 |
| 2002/0083891 A1* | 7/2002 | Vodakov et al. .............. | 117/104 |
| 2006/0254505 A1* | 11/2006 | Tsvetkov et al. ............. | 117/104 |

(Continued)

FOREIGN PATENT DOCUMENTS

| | | |
|---|---|---|
| DE | 19833755 A1 | 1/2000 |
| EP | 1154049 A1 | 11/2001 |

(Continued)

OTHER PUBLICATIONS

European Patent Office official communication, Application No. 12 168 341.1, dated Jun. 10, 2014, 5 pages.
EP Search Report for co-pending EP Application No. 12168341.1, dated Sep. 27, 2012, 2 pages.

*Primary Examiner* — Robert M Kunemund
(74) *Attorney, Agent, or Firm* — Barley Snyder

(57) ABSTRACT

The present invention relates to a configuration and in particular a physical vapor transport growth system for simultaneously growing more than one silicon carbide (SiC) bulk crystal. Furthermore, the invention relates to a method for producing such a bulk SiC crystal. A physical vapor transport growth system for simultaneously growing more than one SiC single crystal boule comprises a crucible containing two growth compartments for arranging at least one SiC seed crystal in each of them, and a source material compartment for containing a SiC source material, wherein said source material compartment is arranged symmetrically between said growth compartments and is separated from each of the growth compartments by a gas permeable porous membrane.

17 Claims, 4 Drawing Sheets

(56) References Cited

U.S. PATENT DOCUMENTS

2012/0103249 A1    5/2012  Gupta et al.
2012/0132132 A1*   5/2012  Urakami et al. .............. 117/106

FOREIGN PATENT DOCUMENTS

| EP | 1852528 A1 | 11/2007 |
| WO | 2010/111473 A1 | 9/2010 |

* cited by examiner

PHYSICAL VAPOR TRANSPORT GROWTH SYSTEM FOR SIMULTANEOUSLY GROWING MORE THAN ONE SIC SINGLE CRYSTAL AND METHOD OF GROWING

CROSS-REFERENCE TO RELATED APPLICATION

This application claims priority under 35 U.S.C. §119 to European Patent Application No. 12 168 341.1, filed May 16, 2012.

FIELD OF THE INVENTION

The present invention relates to a configuration and in particular a physical vapor transport growth system for simultaneously growing more than one silicon carbide (SiC) bulk crystal. Furthermore, the invention relates to a method for producing such a bulk SiC crystal.

BACKGROUND

Due to its outstanding physical chemical and electrical properties silicon carbide is used inter alia as a semiconductor substrate material for power electronics semiconductor components, for radio frequency components and for a variety of special light emitting semiconductors components. Bulk SiC crystals with ideally pure and defect-free quality are required as a basis for these products.

As this is known in the art, bulk SiC crystals are generally produced by means of physical vapor deposition techniques, in particular using a sublimation method. Temperatures of more than 2000° C. are required therefore. Physical vapor transport (PVT) is essentially a sublimation and re-condensation process, in which a source material and a seed crystal are placed inside a growth furnace in such a way that the temperature of the source material is higher than that of the seed, so that the source material sublimes and the vapor species diffuse and deposit onto the seed to form single crystals. PVT growth techniques have proven to produce commercially usable SiC substrate materials, however, they suffer from the fact that the growth rate is rather slow with typically being in the range of some 100 μm/h. Thus, there is a need for a process and a belonging apparatus to grow SiC crystals more rapidly with unimpaired characteristics.

FIG. 4 shows a schematic view of a typical PVT growth cell, wherein PVT growth of a SiC single crystal is carried out in a graphite crucible 202 sealed with a graphite lid and loaded with a sublimation source 204 disposed at the bottom of the crucible 202. A single crystal seed 206 is arranged at the crucible top. A thermal insulation material 208 surrounds the crucible 202 and is only open in the region of a heat dissipation channel 110 which generates the temperature gradient which is necessary for re-condensation.

The sublimation source 204 is usually a polycrystalline SiC grain or powder synthesized in a separate process. The loaded crucible 202 is placed inside a growth chamber where it is surrounded by the thermal insulation 208.

Inductive or resistive heating (not shown in the figure) is used to bring the crucible 202 to a suitable temperature, generally between 2000° C. and 2400° C. for the PVT growth of a SiC single crystal on the SiC single crystal seed 206. The growth chamber may for instance be made of fused silica, and an RF coil is positioned with respect to the crucible 202 such that during growth of the single crystal the temperature of the sublimation source 204 is maintained higher than the temperature of the seed crystal 206 (typically with a difference of 10 to 200K).

Upon reaching a suitably high temperature, the sublimation source 204 vaporizes and fills the crucible 202 with a vapor of silicon, Si2C and SiC2 molecules. The temperature difference between the sublimation source 204 and the seed crystal forces the vapor to migrate and to condense on the seed crystal 206, thereby forming a single crystal boule. In order to control the growth rate, PVT growth is typically carried out in the presence of a small pressure of inert gas, usually between several and 100 Torr.

The published US patent application US 2012/0103249 A1 gives examples of such conventional PVT growth systems as shown in FIG. 4. Additionally, this document also proposes to surround the seed crystal by a gas permeable membrane consisting of graphite, for forming an envelope to create a quasi-closed vapor circulation space in the direct vicinity of the seed crystal.

However, as already mentioned, the growth rate of a SiC single crystal on the seed crystal 206 is typically around 100 μm/h and therefore, the growth of suitably large boules takes several days.

Consequently, it is suggested by several publications to grow more than one SiC single crystal boule simultaneously.

For instance, European patent EP 1099014 B1 proposes a device for producing a silicon carbide (SiC) single crystal which contains a crucible having a storage region for holding a stock of solid SiC and having a crystal region for holding two adjacent SiC seed crystals. An insert made from glassy carbon is disposed in the crucible. In the method, solid SiC is sublimed as a result of the stock being heated and SiC in the gas phase is generated, which is conveyed to the SiC seed crystals, on which it grows as an SiC single crystal. A heat flux is controlled by an insert made from glassy carbon. However this known arrangement firstly does not provide the rotationally symmetric temperature field which is necessary for avoiding defects that grow into the SiC boule from the peripheral regions. Secondly, a significant amount of costs is generated by the expensive highly pure crucible materials and the costs for the surrounding apparatus. Thus this known device causes a significantly enlarged diameter compared to the arrangement shown in FIG. 4 and therefore involves higher costs for the higher amount of SiC source material, crucible dimensions and apparatus geometry, possibly even overcompensating the cost reduction by simultaneously growing two bulk crystals.

Moreover, the German published patent application DE 19833755 A1 discloses a PVT growth system, wherein in a common reaction chamber, a plurality of seed crystal holders are arranged one above the other. In particular, the seed crystal holders are arranged along a symmetry axis of the growth apparatus and are separated by perforated screens. However, a problem with this known arrangement is that a sufficiently effective heat dissipation channel can only be provided for the topmost seed crystal and that therefore the crystal growth results for the inner seed crystals are not satisfactory.

On the other hand, U.S. Pat. No. 7,279,040 B1 proposes an arrangement for growing ZnO single crystal boules, where the seed crystals are arranged at opposing ends of a common growth chamber. The ZnO source material is placed in an inner region of the growth chamber. For this end, a source support is provided in the middle of the crucible. However, providing the source support in the arrangement according to this document leads to a lack of symmetry which will impair the characteristics of the simultaneously grown bulk crystals.

SUMMARY

The present invention has been made in view of the above-described problems and has an object of proving a process and a belonging apparatus to grow SiC crystals more rapidly with unimpaired characteristics.

A physical vapor transport growth system for simultaneously growing more than one SiC single crystal boule comprising a crucible containing two growth compartments for arranging at least one SiC seed crystal in each of them, and a source material compartment for containing a SiC source material, wherein said source material compartment is arranged symmetrically between said growth compartments and is separated from each of the growth compartments by a gas permeable porous membrane.

BRIEF DESCRIPTION OF THE DRAWINGS

The accompanying drawings are incorporated into and form a part of the specification to illustrate several embodiments of the present invention. These drawings together with the description serve to explain the principles of the invention. The drawings are merely for the purpose of illustrating the preferred and alternative examples of how the invention can be made and used and are not to be construed as limiting the invention to only the illustrated and described embodiments. Furthermore, several aspects of the embodiments may form—individually or in different combinations—solutions according to the present invention. Further features and advantages will become apparent from the following more particular description of the various embodiments of the invention, as illustrated in the accompanying drawings, in which like references refer to like elements, and wherein.

DETAILED DESCRIPTION OF THE EMBODIMENTS

The present invention will now be explained in more detail with reference to the figures.

Figure 1:
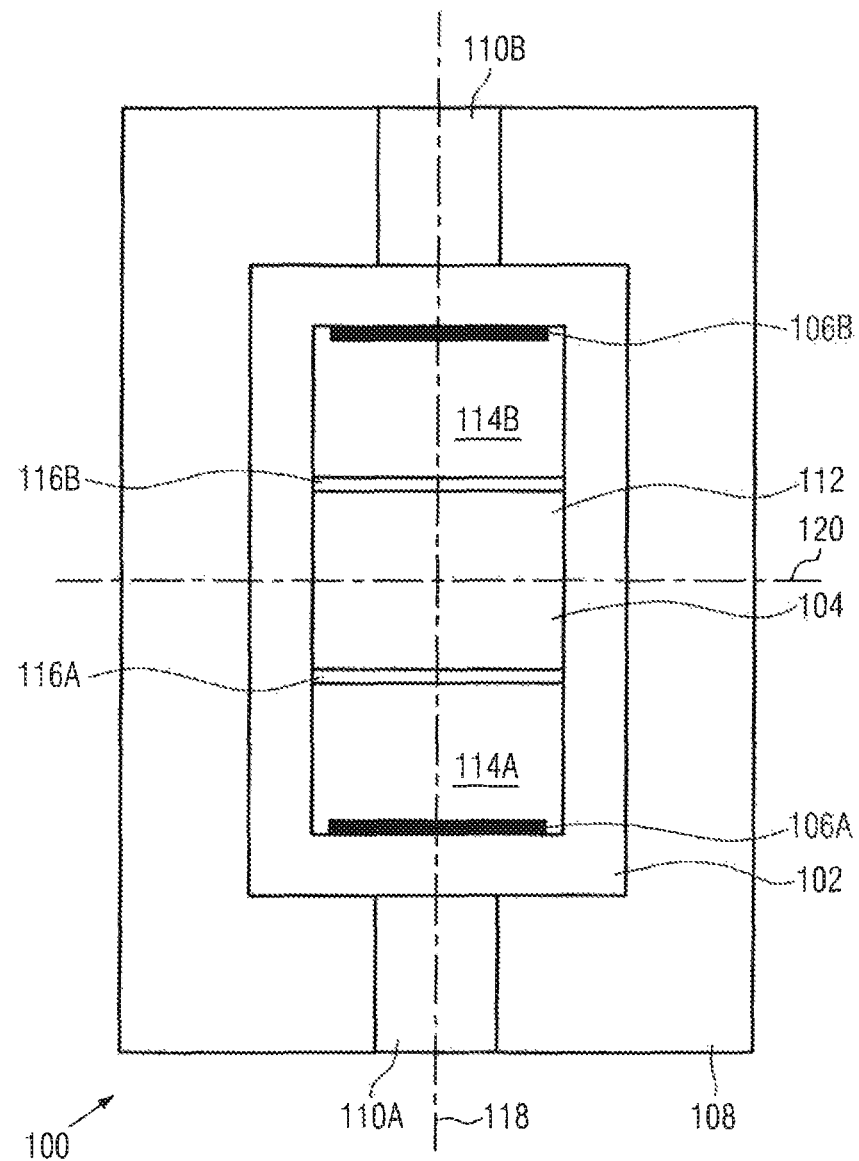
FIG. 1 shows a schematic cross sectional view of a PVT growth apparatus according to a first embodiment.

In particular, FIG. 1 shows a schematic cross sectional view of a physical vapor transport (PVT) growth system 100 for simultaneously growing two SiC bulk crystals according to a first embodiment. The system 100 comprises a crucible 102 which contains a central source material compartment 112 containing SiC powder 104 as the SiC source material.

Two seed crystals 106A and 106B are arranged in growth compartments 114A and 114B. Each of the growth compartments 114A and 114B is separated from the powderous SiC source material 104 by means of a gas permeable porous barrier 116A, 116B. Thus, it is ensured that only gaseous Si and C containing components enter the growth compartments 114A and 114B. Each of the seed crystals 106A, 106B is cooled by means of a respective heat dissipation channel 110A, 110B. According to the present invention, the system 100 is perfectly symmetric in view of the longitudinal axis 118 and a radially intersecting plane 120 which is located in the middle of the source material compartment 112.

The gas permeable porous membranes 116A and 116B (in this application also referred to as "barriers") are preferably fabricated from highly inert and temperature resistant materials, such as graphite, tantalum carbide or tantalum.

In order to provide a sufficient mechanical stability, the membranes should have a thickness of 1 mm to 5 mm, preferably about 2 mm. In particular, when the system 100 of FIG. 1 is arranged in a vertical way, so that barrier 116A has to support the source material 104 against gravity, a sufficient mechanical stability is crucial.

Figure 4:
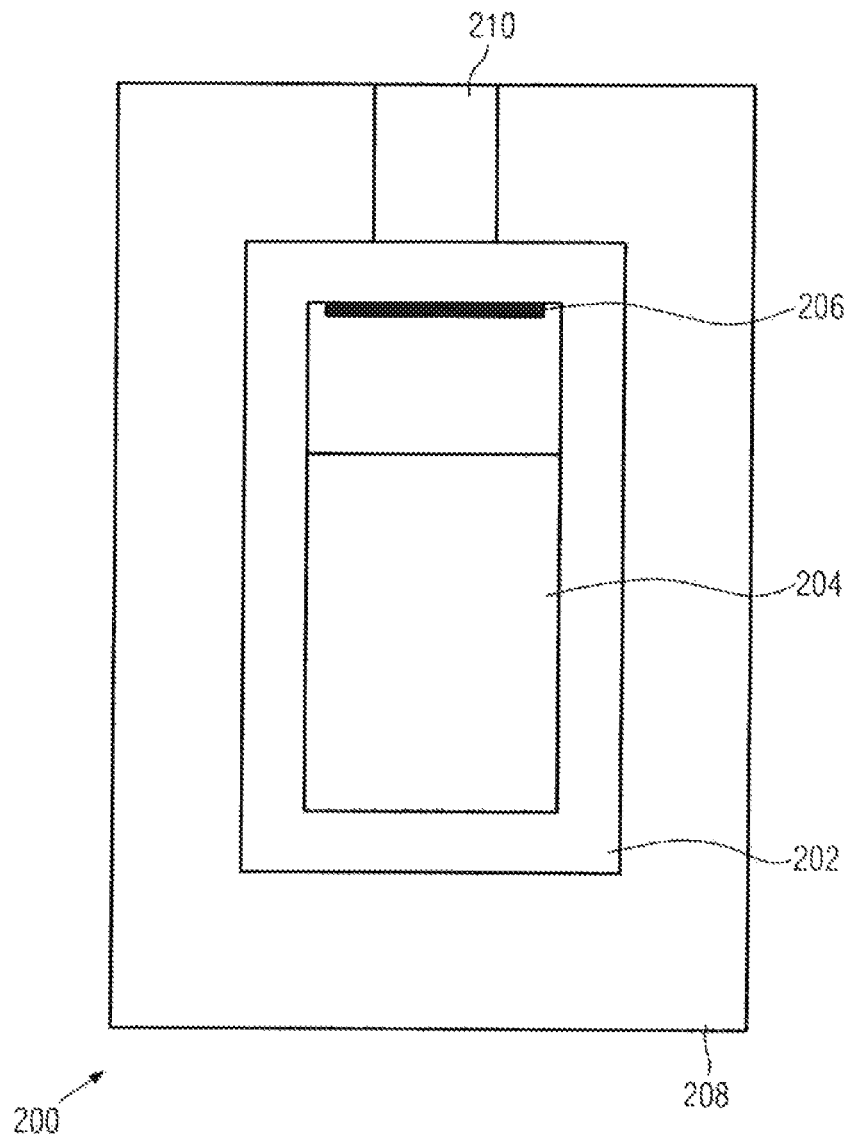
FIG. 4 shows a conventional PVT growth system for one SiC bulk crystal.

On the other hand, the gas permeable porous membranes should present the lowest possible diffusion resistance to the gas components on their way to the seed crystals. It could be shown that values of a density between 0.8 g/cm3 and 1.6 g/cm3, preferably a value of 1.2 g/cm3, yield the most satisfactory results. Nevertheless, compared to the conventional system 200 shown in FIG. 4, the diffusion barriers 116A and 116B of course do provide a significant diffusion resistance.

Figure 2:
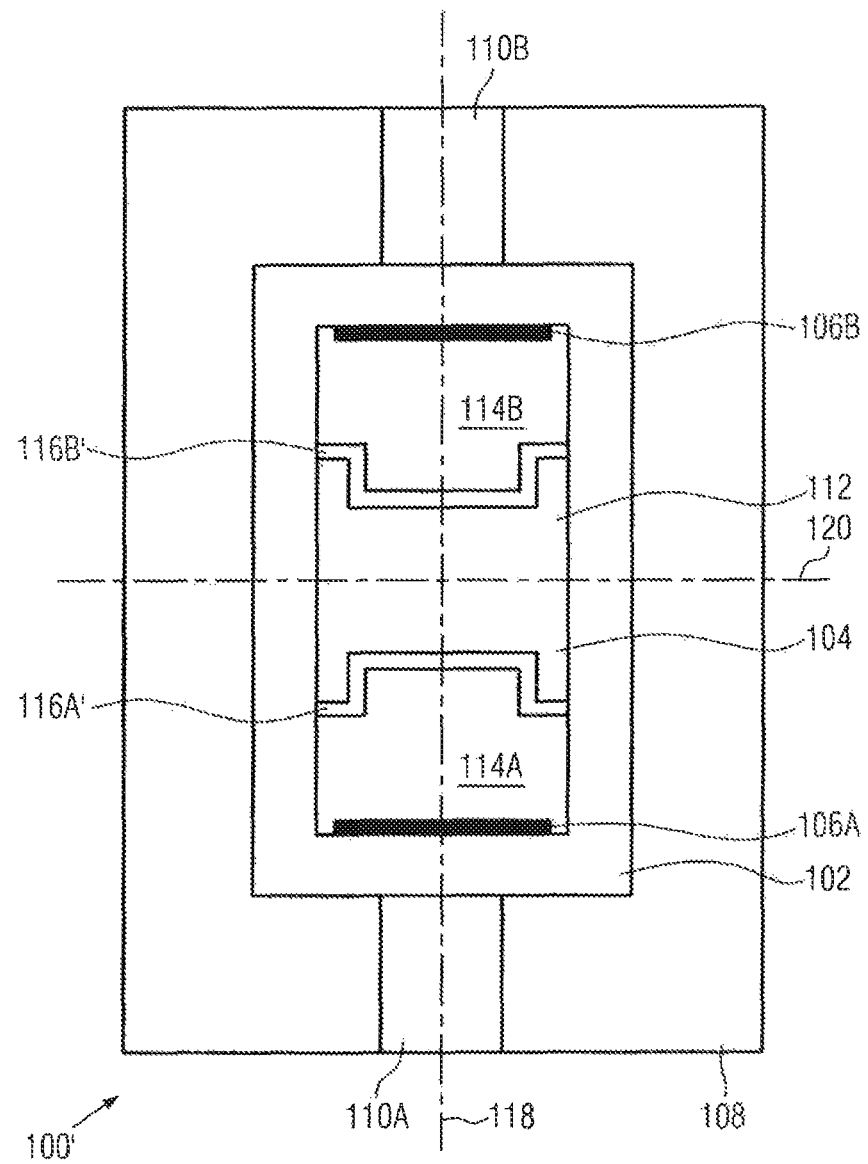
FIG. 2 shows a schematic cross sectional view of a PVT growth apparatus according to a second advantageous embodiment.

In order to alleviate this effect, an improved embodiment as shown in FIG. 2 is proposed according to the present invention.

PVT growth system 100' formed essentially in the same way as the system 100 of FIG. 1 and in particular, has the same longitudinal symmetry axis 118 and across thereto the mirror plane 120. In contrast to the system of FIG. 1, system 100' has two gas permeable porous barriers 116A' and 116B' with an enlarged penetration surface.

According to the embodiment shown in FIG. 2, this is achieved by forming the gas permeable pores membranes with a terraced middle area which is closer to the center of the source material 104 than peripheral regions of the membranes. This particular design of the barriers 116A' and 116B' provides a reduced diffusion resistance compared to the arrangement of FIG. 1, without having to change the outer diameter of the crucible 102. Consequently, the growth rate can be improved and at the same time the costs for the crucible are not enhanced.

Figure 3:
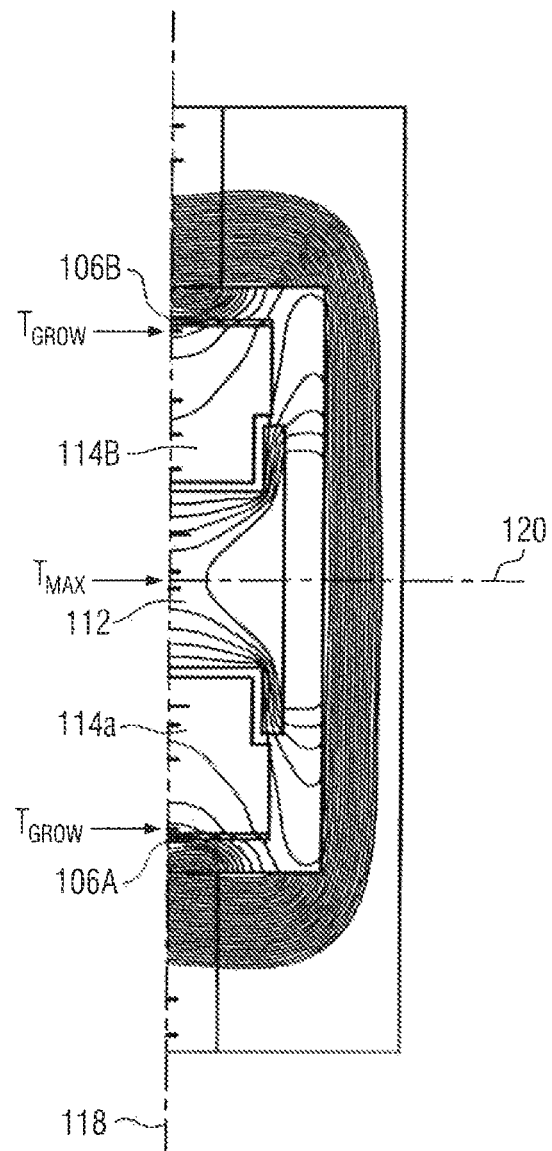
FIG. 3 illustrates the temperature profile present within the system shown in FIG. 2.

FIG. 3 shows a temperature profile of the system 100' shown in FIG. 2. The highest temperature within system 100' is reached in the center of the source material compartment 112, which is heated to a temperature TMAX of about 2700 K. Symmetrically thereto with respect to the mirror plane 120, the temperature at the surface of the growing bulk crystal TGROW has a value of about 2500 K, so that the temperature difference typically has a value of 200 K and preferably lies in a range between 100 K and 300 K.

As may be derived from FIG. 3, the PVT growth system according to the present invention generates a perfectly symmetric temperature profile with regard to a rotational longitudinal symmetry axis 118 on the one hand, and a central mirror plane 120 on the other hand.

In the system according to FIGS. 2 and 3, a distance between the seed crystal surfaces at the beginning of the growth process amounts to typically 300 mm and advantageously lies in a range between 250 mm and 350 mm.

In summary, the present invention provides a PVT growth system for growing two SiC bulk crystals in a particularly cost efficient way and simultaneously by restraining powder shaped source material in a source material compartment and growing the bulk crystals in growth compartments which are arranged perfectly symmetrical with respect to the source material compartment and are separated therefrom by means of gas permeable porous diffusion barriers. In order to limit the maximum outer diameter of these diffusion barriers to be not more than 20% larger than the diameter of the seed crystal and the growing SiC boule, the present invention proposes to provide structures such as steps or terraces in the diffusion barrier. Thus, the length of the penetration area is enhanced without enlarging the outer diameter of the diffusion barrier and the crucible.

As the crucible which has to be formed from highly pure material, is not enlarged by the concept according to the present invention, significant cost reduction can be achieved.

In order to ensure a defect free growth on both surfaces of the seed crystals, a well-defined temperature difference between the source material having the higher temperature and the crystal seeds having the lower temperature, has to be selected. The temperature difference is defined through the diameter of the heat dissipation channels which are formed in the thermal insulation. The larger the diameter of these heat dissipation channels, the larger is the temperature difference between the surface of the seed crystals and the center of the source material compartment. Furthermore, this temperature difference of course is also influenced by the length of the crucible inner longitudinal direction.

In summary, the present invention is based on the idea to provide a completely symmetric PVT growth system for simultaneously growing more than one SiC single crystal boule by partitioning the inner chamber of the crucible into a central source material compartment and two symmetrically arranged growth compartments, each comprising at least one SiC seed crystal. The growth compartments are each separated from the source material compartment by a gas permeable porous barrier. By means of such a perfectly symmetric arrangement, a temperature profile can be generated which has the highest temperature in the center of the source material compartment and regions having an identical lower temperature at the site of the seed crystals.

According to an advantageous embodiment, the gas permeable porous membrane comprises graphite, tantalum carbide or tantalum. Other suitable materials may of course also be used.

The SiC source material may comprise SiC grains or powder. In particular, the powder may be in direct contact with the porous membranes.

An advantage of the PVT growth system according to present invention can be seen in the fact that two single crystals can be grown simultaneously and a perfectly symmetric temperature profile can be guaranteed. Furthermore, the diameter of the crucible as well as the amount of source material stays almost unchanged compared to the conventional arrangement shown in FIG. 4.

Furthermore, by encapsulating the SiC powder using two gas permeable porous membranes, a contamination of the growing crystals by powder particles can effectively be avoided.

According to an advantageous embodiment, the gas permeable porous membranes have a density in a range between 0.8 g/cm3 to 1.6 g/cm3 and in particular of 1.2 g/cm3. Thus, the diffusion of the vaporous Si and C containing gas molecules occurs without presenting a too high diffusion resistance. On the other hand, the pores are small enough to retain even fine powder particles within the source material compartment.

In order to ensure a sufficient mechanical stability of the membranes, they have a thickness in a range between 1 mm and 5 mm, preferably of 2 mm.

In order to further reduce the diffusion resistance, the gas permeable membranes may be provided with structures that enlarge their penetration surface. Such structures may comprise one or more steps, terraces, or meandering cross-sectional parts. For instance, the gas permeable membranes may be provided with a plateau-shaped inner region which is arranged in a distance from the plane in which the seed crystal is arranged, which is larger than the distance of the peripheral region of the membrane. Preferably, these two membranes provided with such a plateau are arranged in a symmetric way with regard to the source material compartment. The symmetry is defined regarding a mirror plane that extends across to the longitudinal axis of the system and extends through the centre of the source material compartment.

By using a geometry where the outer diameter of the gas permeable porous membranes is not larger than 120% of the outer diameter of the seed crystals, a particularly uniform crystal growth can be achieved.

Due to the fact that most of the energy that drives the material flow is provided by the temperature gradient, the present invention may be realized as a horizontal and as a vertical PVT growth system.

While the present invention has been described based on the embodiments, the structures described in the embodiments above can be selectively adopted or omitted or can be changed to another structure without deviating from the gist of the present invention.

What is claimed is:

1. A physical vapor transport growth system for simultaneously growing more than one silicon carbide single crystal boule, said system comprising:
    a crucible containing two growth compartments for arranging at least one silicon carbide seed crystal in each of them, and a source material compartment for containing a silicon carbide source material;
    wherein said source material compartment is arranged symmetrically between said growth compartments and is separated from each of the growth compartments by gas permeable porous membranes, at least one of the gas permeable porous membranes having a cross-sectional geometry with a step forming a terrace.

2. The system according to claim 1, wherein the gas permeable porous membranes comprise graphite, tantalum carbide, or tantalum.

3. The system according to claim 1, wherein said source material compartment is formed to receive silicon carbide powder.

4. The system according to claim 1, wherein the gas permeable porous membranes have a density of 0.8 g·cm-3 to 1.6 g·cm-3.

5. The system according to claim 4, wherein the gas permeable porous membranes have a density of 1.2 g·cm-3.

6. The system according to claim 1, wherein the gas permeable porous membranes have a thickness of 1 mm to 5 mm.

7. The system according to claim 6, wherein the gas permeable porous membranes have a thickness of 2 mm.

8. The system according to claim 1, wherein at least one of the gas permeable porous membranes has a plateau-shaped inner region which is arranged in a distance from a plane in which the seed crystal is arranged, which is larger than the distance of a peripheral region of the membrane from said plane.

9. The system according to claim 1, wherein the outer diameter of the gas permeable porous membranes measure no more than 120% of an outer diameter of said silicon carbide seed crystals.

10. The system according to claim 9, wherein the surface of the gas permeable porous membranes are more than twice the surface of the seed crystals.

11. The system according to claim 1, wherein the distance between the two seed crystals is between 250 mm to 350 mm.

12. The system according to claim 1, wherein the distance between the two seed crystals is 300 mm.

13. A method for simultaneously growing at least two silicon carbide singe crystal boules in a physical vapor transport growth system, the method comprising the steps of:

arranging a silicon carbide powder source material in a source material compartment;

arranging at least one silicon carbide seed crystal within each of two growth compartments, wherein said source material compartment is arranged symmetrically between said growth compartments and is separated from each of the growth compartments by gas permeable porous membranes, at least one of the gas permeable porous membranes having a cross-sectional geometry with a step forming a terrace; and applying an elevated temperature which has profile being symmetric with respect to a longitudinal axis of the physical vapor transport growth system.

14. The method according to claim 13, wherein the temperature difference between the centre of the source material compartment and a surface of the silicon carbide seed crystals is between 100 K to 300 K.

15. The method according to claim 13, wherein the temperature difference between the centre of the source material compartment and a surface of the silicon carbide seed crystals is 200 K.

16. The method according to claim 13, wherein a longitudinal middle axis of the system is oriented in a vertical direction, so that in one of the growth compartments, a silicon carbide single crystal grows against the direction of gravity, and in the other of the growth compartments, a silicon carbide single crystal grows in the direction of gravity.

17. The method according to claim 13, wherein a longitudinal middle axis of the system is oriented in horizontal direction, so that the single crystals in both growth compartments grow in a direction across to the direction of gravity.

* * * * *